United States Patent [19]

Hayakawa et al.

[11] Patent Number: 4,901,103

[45] Date of Patent: Feb. 13, 1990

[54] IMAGE RECORDING APPARATUS USING PRESSURE SENSITIVE SHEET

[75] Inventors: Kiyoharu Hayakawa, Ama; Yumio Matsumoto, Kasugai; Masashi Ueda, Nagoya; Akira Sago, Nagoya; Osamu Tagaki, Nagoya, all of Japan

[73] Assignee: Brother Kogyo Kabushiki Kaisha, Aichi, Japan

[21] Appl. No.: 201,905

[22] Filed: Jun. 3, 1988

[30] Foreign Application Priority Data

Jun. 8, 1987 [JP] Japan ............................ 62-142554
Jun. 8, 1987 [JP] Japan ............................ 62-142555

[51] Int. Cl.$^4$ .................................. G03B 27/52
[52] U.S. Cl. ........................... 355/27; 100/158 R; 100/171
[58] Field of Search ............... 355/27, 28; 100/156, 100/158 R, 160, 168, 169, 171, 176

[56] References Cited

U.S. PATENT DOCUMENTS 4,727,392  2/1988  Stone et al. .................. 355/27 X
4,806,982  2/1989  Yamamoto et al. ............. 355/27

Primary Examiner—L. T. Hix
Assistant Examiner—D. Rutledge
Attorney, Agent, or Firm—Oliff & Berridge

[57] ABSTRACT

A pressure developing device having a pair of pressure developing rollers in an image recording apparatus. A pressure-sensitive recording sheet can be fed to pass between the pressure developing rollers, and has a pressure-sensitive image bearing layer on one surface thereof. A developer sheet can selectively be fed to pass between the pressure developing rollers in superposed relation to the pressure-sensitive image bearing layer. The pressure developing rollers are spaced from each other by a gap which is greater than the thickness of the pressure-sensitive sheet and smaller than the combined thickness of the pressure-sensitive sheet and the developer sheet. The pressure developing device also includes a friction roller held against a surface of the pressure-sensitive recording sheet opposite to the image bearing layer and rotatable for frictionally feeding the pressure-sensitive recording sheet.

6 Claims, 2 Drawing Sheets

IMAGE RECORDING APPARATUS USING PRESSURE SENSITIVE SHEET

BACKGROUND OF THE INVENTION

The present invention relates to an image recording apparatus using a pressure sensitive sheet. More particularly, the invention relates to a pressure developing device in the image recording apparatus for developing a latent image on a pressure-sensitive recording sheet and transferring the image as a visible image onto a developer sheet, under pressure. The invention also relates to a sheet feeding mechanism for feeding a web like pressure sensitive recording sheet for use in the image recording apparatus.

U.S. Pat. No. 4,440,846 discloses an image recording system in which a developer sheet and a photosensitive pressure-sensitive recording sheet exposed to light bearing a latent image are superposed on each other and pressed together to develop the image on the developer sheet. The photosensitive pressure-sensitive recording sheet has a coated layer of pressure-rupturable microcapsules encapsulating a photosensitive composition. Such image forming technique is generally referred to as transfer type image recording method in which the developer material is coated on a substrate such as a developer sheet, which developer material is reacted with encapsulated chromogenic material provided on a separate sheet as described in U.S. Pat. No. 4,399,209.

Generally, the photosensitive pressure-sensitive recording sheet is in the form of a roll, and the developer sheet is in the form of a cut sheet. The photosensitive pressure-sensitive recording sheet is normally gripped or nipped between a pair of pressure developing means or rollers. When microcapsules on the photosensitive pressure-sensitive recording sheet are ruptured by being pressed between the pressure developing rollers, the photosensitive composition is released from the ruptured microcapsules. One problem with the conventional arrangement is that the released photosensitive composition tends to be attached to the surfaces of the pressure developing rollers.

In another aspect, the photosensitive pressure-sensitive recording sheet is fed by either a takeup roll which pulls the recording sheet or a pair of feed rollers which grip and feed the opposite side edges of the web like recording sheet. Feeding the photosensitive pressure-sensitive recording sheet with the takeup roll is disadvantageous in that as the photosensitive pressure-sensitive recording sheet is wound on the takeup roll, the diameter of the takeup roll is progressively increased and the speed at which the recording sheet is fed is progressively increased so far as the takeup roll is rotated at constant angular velocity. As a result, the latent image on the photosensitive pressure-sensitive recording sheet, which latent image is formed by the light-exposure to an original, may be distorted or the exposed area on the photosensitive pressure-sensitive recording sheet may be brought out of exact registry with the developer sheet, to thereby degrade the resultant final visible image on the developer sheet.

It would be possible to control the speed at which the recording sheet is wound on the takeup roll in accordance with the diameter of the takeup roll. However, this would require a sensor for detecting the speed of travel of the photosensitive pressure-sensitive recording sheet as well as a highly accurate speed-controllable motor for driving the takeup roll, resulting in an increased cost of manufacture.

On the other hand, where the feed rollers are used to grip the side edges of the photosensitive pressure-sensitive recording sheet, the side edges of the recording sheet are not available for image recording since the microcapsules on the side edges are ruptured by the feed rollers. Therefore, the use of the feed rollers has an economic disadvantage in that the photosensitive pressure-sensitive recording sheet must have an increased width so as to provide sufficient zones undergoing such feeding only, and also suffers a maintenance problem in that any photosensitive composition deposited on the feed rollers must be cleaned away.

SUMMARY OF THE INVENTION

It is an object of the present invention to provide a pressure developing device having pressure developing rollers which do not exert a pressure on a photosensitive pressure-sensitive recording sheet when no image should be developed.

Another object of the present invention is to provide a pressure developing device which comprises pressure developing rollers that are positioned so that the torque required to be produced by a drive motor for rotating the pressure developing rollers in gripping a photosensitive pressure-sensitive recording sheet and a developer sheet is reduced, thereby lessening the load on the motor or reducing the size of the motor.

Still another object of the present invention is to provide a sheet feed mechanism having a simple structure which is capable of feeding a photosensitive pressure-sensitive recording sheet at a constant speed.

According to the present invention, there is provided a pressure developing device comprising a pair of pressure developing rollers. A gap defined between the rollers is optimumly provided, which is one of the features of this invention. A pressure-sensitive recording sheet is fed to pass between the pressure developing rollers, and has a pressure-sensitive image bearing layer on one surface thereof. A developer sheet is selectively fed to pass between the pressure developing rollers in superposed relation to the pressure-sensitive image bearing layer. The pressure developing rollers are spaced from each other by the gap which is greater than the thickness of the pressure-sensitive sheet and smaller than the combined thickness of the pressure-sensitive sheet and the developer sheet.

The pressure developing device also includes a friction roller held against a surface of the pressure-sensitive recording sheet opposite to the image bearing layer and rotatable at a constant speed for frictionally feeding the pressure-sensitive recording sheet.

According to the present invention, there is also provided a sheet feed mechanism in the image recording apparatus for feeding an elongated recording sheet having an image bearing surface and unreeled from a supply roll, the sheet feed mechanism comprising a friction roller held against a surface of the recording sheet opposite to the image bearing surface and rotatable for frictionally feeding the recording sheet.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
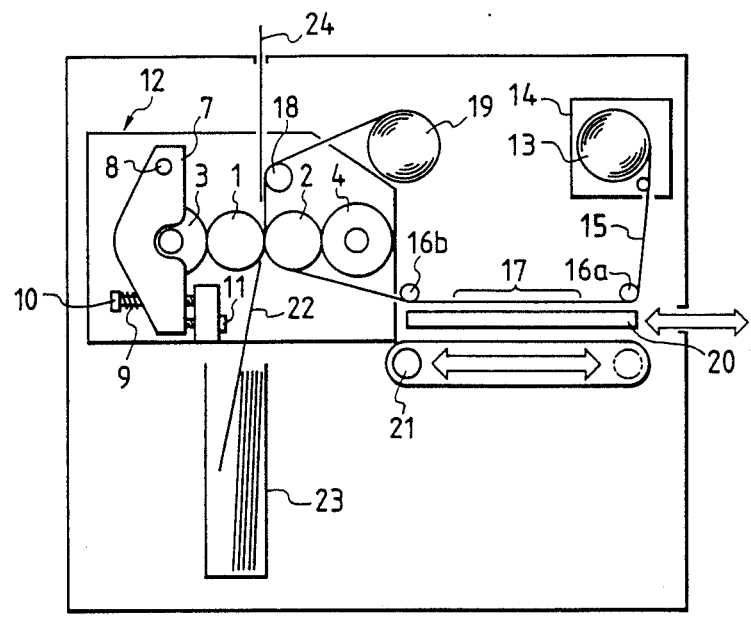
FIG. 1 is a schematic vertical cross-sectional view showing an image output apparatus incorporating a pressure developing device according to the present invention.
Figure 2:
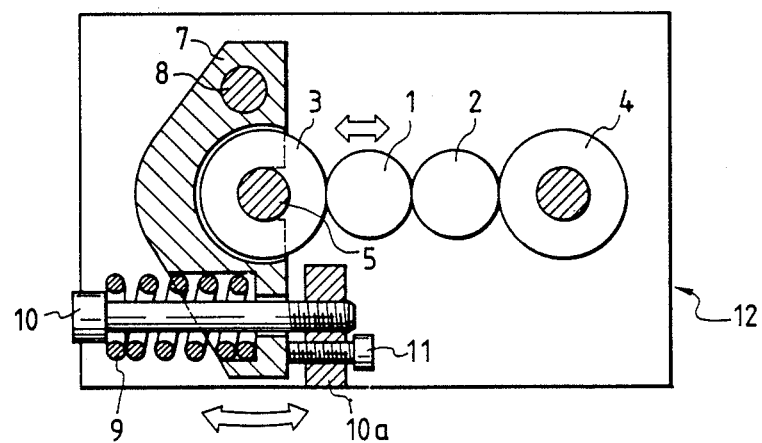
FIG. 2 is an enlarged vertical cross-sectional view showing the pressure developing device shown in FIG. 1.

FIG. 2 schematically shows an image output apparatus including a pressure developing device 12 having a pair of pressure developing rollers 1, 2 disposed in confronting relation to each other. The apparatus also includes a pair of backup rollers 3, 4 positioned behind and held against the pressure developing rollers 1, 2, respectively. As shown in FIG. 1, a photosensitive pressure-sensitive sheet 15 coated on one side with a layer of pressure-rupturable microcapsules is unreeled from a supply roll 13 stored in a roll sheet cassette 14 and is passed through an exposure unit 17 disposed between two horizontally spaced guide rollers 16a, 16b. Then, the photosensitive pressure-sensitive sheet 15 runs between the pressure developing rollers 1, 2 and around a separator roller 18, and is wound on a takeup roll 19.

An original 20 to be imaged or copied is set in the exposure unit 17, which includes a light source 21 such as a fluorescent lamp that is horizontally movably disposed beneath the original 20. A developer sheet cassette 23 is positioned downwardly of the pressure developing device 12, and houses a supply of cut developer sheets 23 therein.

As shown in FIG. 2, the backup roller 3 held against the pressure developing roller 1 has a roller shaft 5 rotatably supported by a load lever 7 having one end pivotally mounted on a pivot shaft 8 and the other end on which a load adjusting rod or screw 10 and a load spring 9 are mounted. The load adjusting rod 10 has a threaded end threaded through a block 10a attached to the casing of the pressure developing device 12. The load lever 7 is normally urged to swing toward the pressure developing roller 1 by the biasing force of the load spring 9. The swinging movement of the load lever 7 is limited by a load stopper screw 11 threaded through the block 10a because of the abutment between the distal end of the screw 11 and the load lever 7. Therefore, the gap or spacing between the pressure developing rollers 1, 2 can be adjusted by adjustably turning the load stopper screw 11 in the block 10a. According to the present invention, the gap between the pressure developing rollers 1, 2 is selected so as to be larger than the thickness of the photosensitive pressure-sensitive recording sheet 15, but smaller than the combined thickness of the recording sheet 15 and the developer sheet 22.

The image output device operates as follows: First, the original 20 to be imaged is inserted into the exposure unit 17. The fluorescent lamp 2 is horizontally moved back and forth to apply light which is transmitted through the original 20 to the photosensitive pressure-sensitive recording sheet 15 which is thus exposed to the light in the pattern of an image on the original 20. Then, the photosensitive pressure-sensitive recording sheet 15 is fed to the left (as shown) into overlapping relation to a developer sheet 22 supplied from the developer sheet cassette 23. At this time, the gap between the pressure developing rollers 1, 2 is smaller than the combined thickness of the recording sheet 15 and the developer sheet 22. Therefore, the gripping force or pressure applied by the pressure developing rollers 1, 2 is applied to the sheets 15, 22 to form a developed image on the developer sheet 22 in the manner described in Japanese Laid-Open Patent Publication No. 58-88740. More specifically, the pressure developing rollers 1, 2 press the sheets 15, 22 to rupture those microcapsules on the sheet 22 which are not photo-cured in the exposure unit 17, for thereby releasing the dye precursor that reacts with the color developers on the sheet 22 to develop an image on the sheet 12. At this time, the load lever 7 is slightly spaced from the load stopper screw 11 because of the sheets 15, 22 sandwiched between the pressure developing rollers 1, 2, so that the resilient force of the load spring 9 is applied to the pressure developing roller 1 for effective image development under pressure.

After the development, the photosensitive pressure-sensitive recording sheet 15 is separated from an output image sheet 24, which is the developer sheet 22 with the developed image thereon, by the separator roller 18, and is then wound on the takeup roll 19. After the developer sheet 22 has moved beyond the pressure developing rollers 1, 2, the pressure developing rollers 1, 2 do not apply any pressure onto the photosensitive pressure-sensitive recording sheet 15, since the gap between the pressure developing rollers 1, 2 is larger than the thickness of the recording sheet 15. Therefore, the microcapsules on the recording sheet 15 are not ruptured by the pressure developing rollers 1, 2, and hence the photosensitive material contained in the microcapsules is not subjected to pressure by the pressure developing rollers 1, 2.

The pressure developing rollers 1, 2 are therefore not smeared by the photosensitive material contained in the microcapsules. Thus, the pressure developing rollers 1, 2 can be used for a long period of time without frequent maintenance or overhauling. Further, since the gap is provided between the pressure developing rollers 1, 2, which gap is slightly larger than the thickness of the photosensitive pressure-sensitive recording sheet 15, the torque required to rotate the pressure developing rollers 1, 2 when the developer sheet 22 is also gripped between these rollers 1, 2 is reduced. Therefore, the drive source, e.g., a motor, for rotating the pressure developing rollers 1, 2 is subjected to a smaller load, may be of a smaller size, and consumes a smaller amount of energy.

Figure 3:
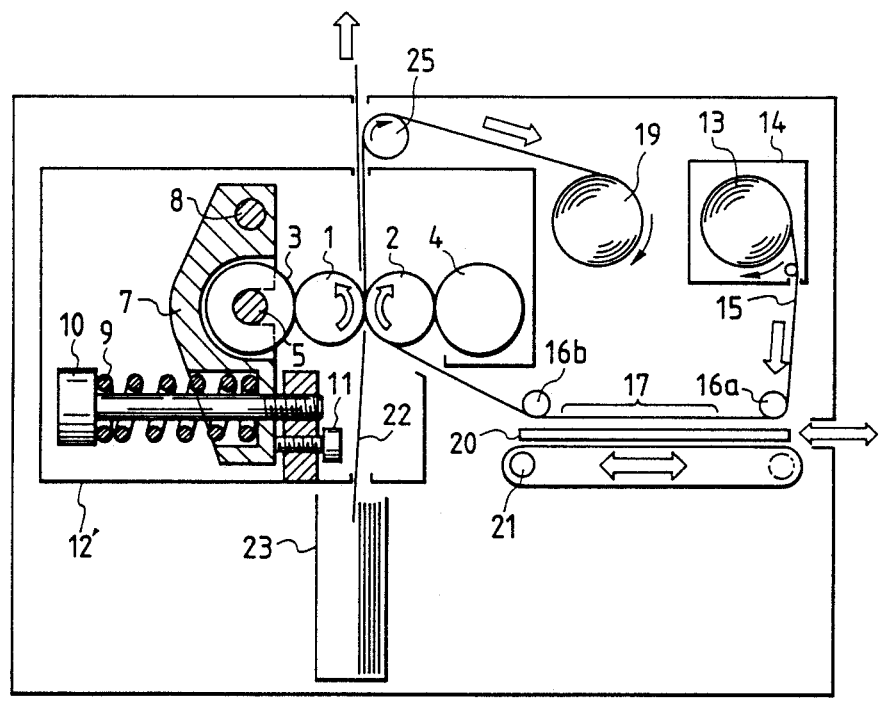
FIG. 3 is a schematic cross-sectional view showing the pressure developing device, with a sheet feed mechanism combined therewith.

FIG. 3 shows a pressure developing device 12' which is substantially the same as the pressure developing device 12, wherein like parts and components are designated by the same reference numerals and characters as those shown in FIGS. 1 and 2. The pressure developing device 12' includes a sheet feed mechanism according to the present invention. The sheet feed mechanism comprises a friction roller 25 disposed above the pressure developing device 12'. The friction roller 25 is positioned such that the photosensitive pressure-sensitive recording sheet 15 travels around the friction roller 25 while the back surface of the recording sheet 15, opposite to the coated side thereof, is being held against the friction roller 25, and is directed toward the takeup roll 19. The friction roller 25 comprises a rubber roller having a high coefficient of friction for exerting high frictional resistance to the recording sheet 15. The friction roller 25 is operatively coupled to a drive source (not shown) so as to be rotated at a constant speed.

During operation of the image output apparatus, when no developer sheet is supplied between the pressure developing rollers 1, 2, the photosensitive pressure-sensitive recording sheet 15 is pulled by the frictional forces produced by the friction roll 25 and fed between the pressure developing rollers 1, 2. When a developer sheet 22 is superposed on the recording sheet 15 and these sheets 22, 15 are pressed by the pressure developing rollers 1, 2 for image development, the speed of travel of the sheets 22, 15 is controlled by the gripping forces applied by the pressure developing rollers 1, 2, rather than by the frictional forces applied by the friction roller 25. Therefore, before and after the developer sheet 22 are nipped by the pressure developing rollers 1, 2, the photosensitive pressure-sensitive recording sheet 15 is tensioned by the friction roller 25 without being slackened, and is fed at a constant speed by the friction roller 25 regardless of the diameter of the takeup roll 19. Since the photosensitive pressure-sensitive sheet 15 is fed along at a constant speed, as described above, the developer sheet 22 can be brought into exact registry with the recording sheet 15, so that a desired image can be developed and recorded to a nicety. Moreover, inasmuch as the friction roller 25 is simple, it is manufactured at a low cost.

The takeup roll 19 is rotated with a torque and at a speed which are large enough to wind the photosensitive pressure-sensitive recording sheet 15 which has been pulled by the friction roller 25.

The pressure developing device 12, 12' may be associated with a thermal fixing device for thermally fixing the image on a developer sheet 22 discharged from the pressure developing device. The light source 21 may be a tungsten lamp. While the photosensitive pressure-sensitive recording sheet 15 is shown as exposed to light that has passed through the original 20 held against the recording sheet 15, the recording sheet 15 may be exposed to light which has been reflected from the original 20 and focused on the recording sheet 15, or light which has passed through the original 20 and focused on the recording sheet 15.

Although a certain preferred embodiment has been shown and described, it should be understood that many changes and modifications may be made therein without departing from the scope of the appended claims.

What is claimed is:

1. A pressure developing device for use in an image recording apparatus which uses a pressure-sensitive recording sheet and a developer sheet, comprising;
   a pair of pressure developing rollers, said pressure-sensitive recording sheet being fed to pass between said pressure developing rollers and having a pressure-sensitive image bearing layer on one surface thereof, said developer sheet being selectively fed to pass between said pressure developing rollers in superposed relation to said pressure-sensitive image bearing layer, said pressure developing rollers being spaced from each other by a gap which is greater than a thickness of said pressure-sensitive sheet and smaller than a combined thickness of said pressure-sensitive sheet and said developer sheet.

2. The pressure developing device as defined in claim 1, wherein at least one of said pressure developing rollers is movable toward and away from the other pressure developing roller.

3. The pressure developing device as defined in claim 2, further comprising:
   a pair of backup rollers disposed behind and held against said pressure developing rollers, respectively;
   a load lever supporting said one of the pressure developing rollers, said load lever having a pivotally supported end and an adjustably positioned opposite end which is resiliently urged to displace said one pressure developing roller toward the other pressure developing roller.

4. The pressure developing device as defined in claim 1, further comprising a friction roller held against a surface of said pressure-sensitive recording sheet opposite to said image bearing layer, said friction roller being rotatable at a constant speed for frictionally feeding said pressure-sensitive recording sheet.

5. A sheet feed mechanism for feeding a web-like pressure-sensitive recording sheet for use in an image recording apparatus which comprises an exposure unit, and a pressure developing unit disposed at a downstream side of said exposure unit, said pressure-sensitive recording sheet being selectively superposed with a developer sheet at said pressure developing unit, said sheet feed mechanism comprising;
   a supply roll for supplying said pressure-sensitive recording sheet, said pressure-sensitive recording sheet having a pressure-sensitive image bearing layer on one surface thereof and being fed to pass between said pressure developing unit, and said developer sheet being selectively fed to pass between said pressure developing unit in superposed relation to said pressure-sensitive image bearing layer;
   a takeup roll for winding said pressure sensitive recording sheet; and,
   a friction roller held against a surface of said pressure sensitive recording sheet opposite to said image bearing surface and rotatable at a constant speed for frictionally feeding said recording sheet.

6. The sheet feed mechanism as defined in claim 5, wherein said friction roller is positioned at a downstream side of said pressure developing unit and upstream of said takeup roll.

* * * * *